US009401239B2

(12) United States Patent
Bell et al.

(10) Patent No.: US 9,401,239 B2
(45) Date of Patent: Jul. 26, 2016

(54) ELECTRICAL COMPONENT FOR ATTACHMENT TO PAPER AND OTHER SUBSTRATES AND MAGNETIC ATTACHMENT MECHANISM

(71) Applicant: Electroninks Writeables, Inc., Austin, TX (US)

(72) Inventors: Michael A. Bell, Cambridge, MA (US); Analisa Russo, Cambridge, MA (US)

(73) Assignee: ELECTRONINKS WRITEABLES, INC., Austin, TX (US)

( * ) Notice: Subject to any disclaimer, the term of this patent is extended or adjusted under 35 U.S.C. 154(b) by 0 days.

(21) Appl. No.: 14/687,040

(22) Filed: Apr. 15, 2015

(65) Prior Publication Data

US 2015/0302964 A1    Oct. 22, 2015

Related U.S. Application Data

(60) Provisional application No. 61/980,810, filed on Apr. 17, 2014.

(51) Int. Cl.
*H01F 7/02* (2006.01)
*H05K 1/18* (2006.01)
*H05K 1/11* (2006.01)

(52) U.S. Cl.
CPC .............. *H01F 7/0252* (2013.01); *H05K 1/11* (2013.01); *H05K 1/181* (2013.01); *H05K 2201/08* (2013.01); *H05K 2201/10265* (2013.01)

(58) Field of Classification Search
CPC ........ H01F 7/0252; H05K 1/181; H05K 1/11; H05K 2201/10265; H05K 2201/08
See application file for complete search history.

(56) References Cited

U.S. PATENT DOCUMENTS

| 6,919,787 | B1* | 7/2005 | Macken | H01F 7/0242 335/285 |
|---|---|---|---|---|
| 2012/0068798 | A1* | 3/2012 | Lauder | G06F 1/1613 335/306 |

OTHER PUBLICATIONS

Buechley, L. et al., "Paints, Paper, and Programs: First Steps Toward the Computational Sketchbook," *Proceedings of the Third International Conference on Tangible and Embedded Interaction*, Cambridge, UK (2009) pp. 9-12.

Hodges, S. et al., "Circuit Stickers: Peel-and-Stick Construction of Interactive Electronic Prototypes," *Proceedings of the ACM CHI Conference on Human Factors in Computing Systems*, Ontario, CA (2014) pp. 1-4.

* cited by examiner

*Primary Examiner* — Mohamad Musleh
(74) *Attorney, Agent, or Firm* — DLA Piper LLP (US); Stephanie X. Wang

(57) ABSTRACT

An electrical component for attachment to paper and other substrates comprises, according to one embodiment, a functional electronic part including one or more support pillars on an underside thereof. Each of the support pillars comprises: a channel extending therethrough from a top opening to a bottom opening, where the top opening of the channel is adjacent to the functional electronic part; and a magnet moveably positioned in the channel in electrical contact with the functional electronic part, where the bottom opening of the channel has a width smaller than a maximum lateral dimension of the magnet.

20 Claims, 6 Drawing Sheets

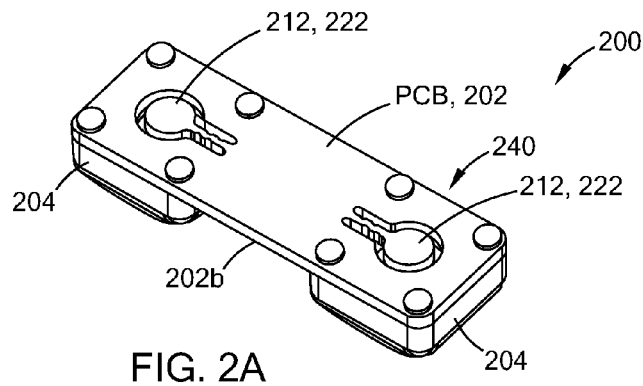
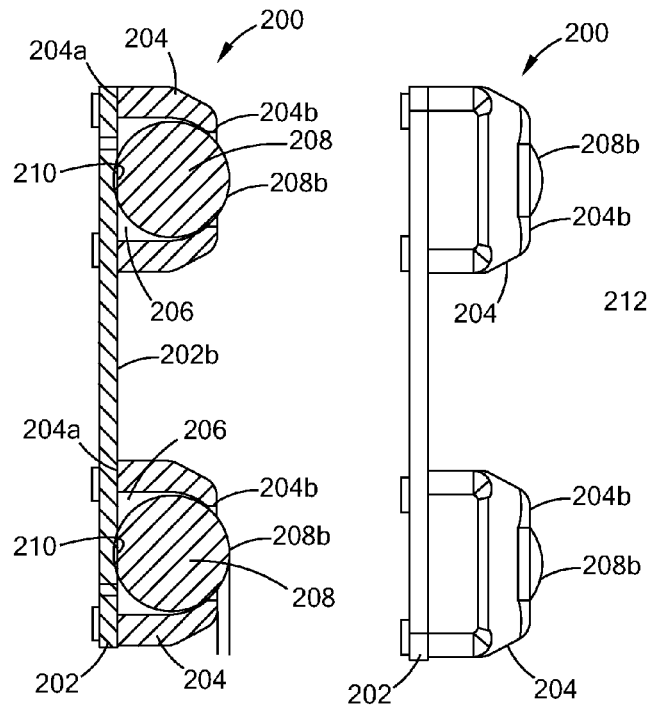 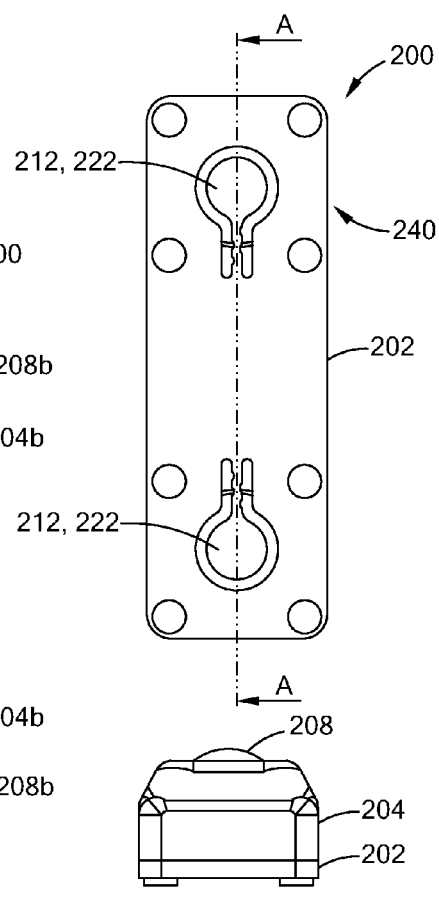
FIG. 2A
FIG. 2B    FIG. 2C    FIG. 2D

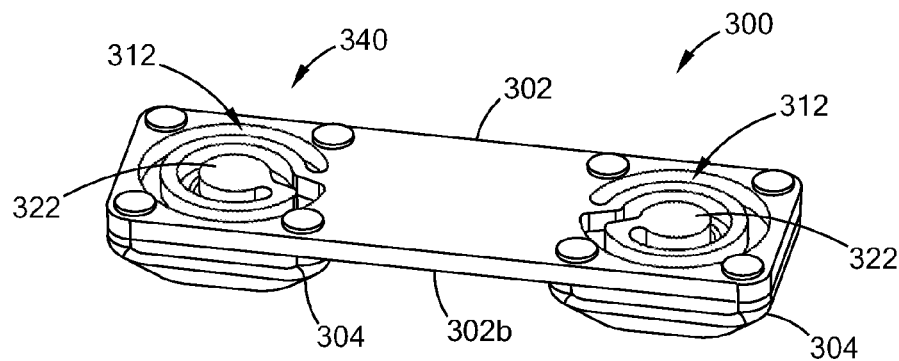
FIG. 3A
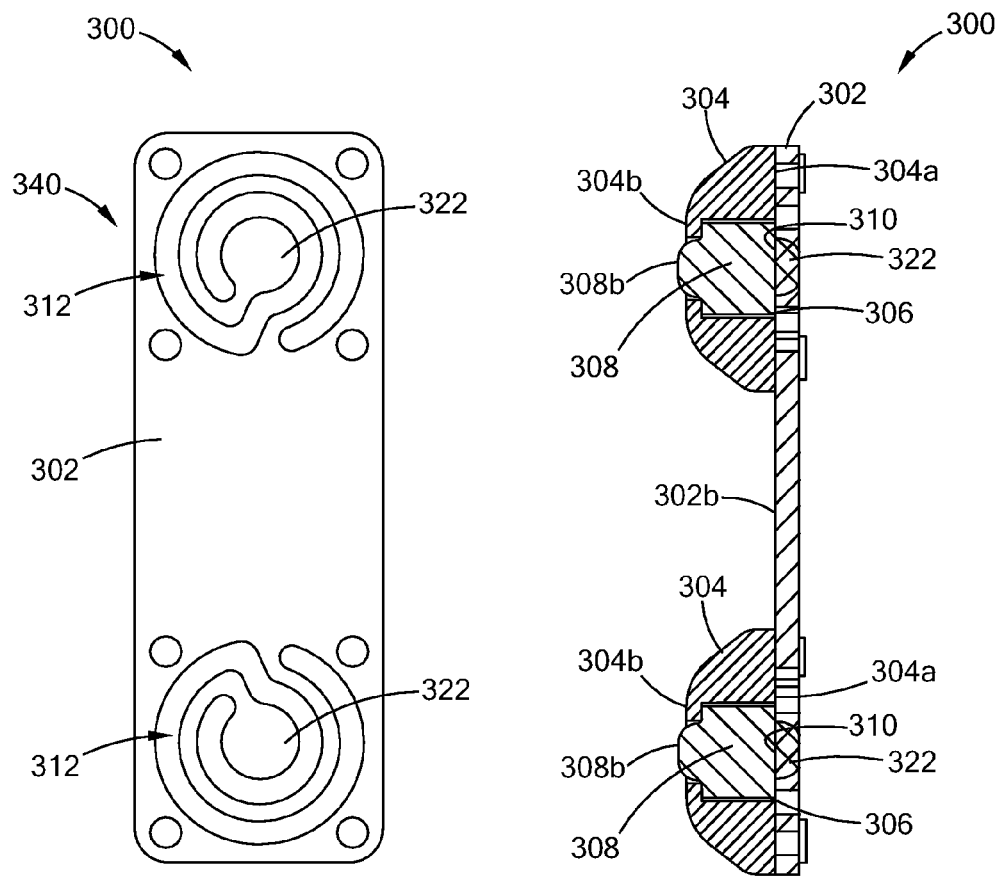
FIG. 3B
FIG. 3C

ELECTRICAL COMPONENT FOR ATTACHMENT TO PAPER AND OTHER SUBSTRATES AND MAGNETIC ATTACHMENT MECHANISM

RELATED APPLICATION

The present patent document claims the benefit of priority under 35 U.S.C. §119(e) to U.S. Provisional Patent Application Ser. No. 61/980,810, filed on Apr. 17, 2014, which is hereby incorporated by reference in its entirety.

TECHNICAL FIELD

The present disclosure is related generally to electrical circuits formed using conductive traces on paper and other substrates, and more particularly to attachment of electrical components to such circuits.

BACKGROUND

Printed electronics constitute an emerging technology with potential applications in photovoltaics, transistors, displays, batteries, antennas, and sensors. Recent attention has focused on paper substrates as a low-cost, enabling platform for flexible, lightweight, and disposable electronic circuits. Such circuits require conductive electrodes, which have traditionally been deposited by sputter coating, inkjet printing, and airbrush spraying. Recently, a facile pen-on-paper approach to create flexible printed electronics has been demonstrated. Russo et al. described the use of rollerball pen filled with conductive ink to write conductive traces on paper (Russo et al., "Pen on Paper Flexible Electronics," *Advanced Materials*, 23 (2011) 3426-3430). It would be advantageous to have a quick and easy method to attach electronic components to conductive traces on paper and other substrates to build simple or complex circuits for applications ranging from engineering to education.

BRIEF SUMMARY

An electrical component for attachment to paper and other substrates, a magnetic attachment mechanism, and a method of attaching an electrical component to paper and other substrates are described herein.

According to one embodiment, the electrical component for attachment to paper and other substrates comprises a functional electronic part including one or more support pillars on an underside thereof. Each of the support pillars comprises: a channel extending therethrough from a top opening to a bottom opening, where the top opening of the channel is adjacent to the functional electronic part; and a magnet moveably positioned in the channel in electrical contact with the functional electronic part, where the bottom opening of the channel has a width smaller than a maximum lateral dimension of the magnet.

According to a second embodiment, the electrical component for attachment to paper and other substrates comprises a functional electronic part including one or more support pillars on an underside thereof. Each of the support pillars comprises: a channel extending therethrough from a top opening to a bottom opening, where the top opening of the channel is adjacent to the functional electronic part; and a magnet moveably positioned in the channel in electrical contact with the functional electronic part. A spring is positioned above each of the magnets.

According to a third embodiment, the electrical component for attachment to paper and other substrates comprises a functional electronic part comprising one or more support pillars on an underside thereof, each of the support pillars comprising an elastically deformable magnet in electrical contact with the functional electronic part.

A magnetic attachment mechanism comprises a support pillar for magnetically attaching a component to a substrate, where the support pillar comprises: a channel extending therethrough from a top opening to a bottom opening; a magnet moveably positioned in the channel; and a spring positioned in the channel adjacent to the top opening and above the magnet. When the support pillar is attached to the component, the spring contacts an underside of the component through the top opening, and the magnet can magnetically attach to the substrate through the bottom opening.

A method of attaching an electrical component to paper or another substrate comprises providing a substrate comprising a magnetic material and having a conductive trace on a top surface thereof, and bringing an electrical component toward the top surface of the substrate. The electrical component comprises a functional electronic part including one or more support pillars on an underside thereof. Each of the support pillars comprises: a channel extending therethrough; and a magnet moveably positioned in the channel in electrical contact with the functional electronic part. A spring is positioned above each of the magnets. As the electrical component is brought toward the top surface of the substrate, a magnetic field between each of the magnets and the magnetic material brings a lower surface of each of the magnets in contact with the conductive trace, and the springs allow the support pillars to settle on the top surface independent of the flatness or roughness thereof.

The terms "comprising," "including," "containing" and "having" are used interchangeably throughout this disclosure as open-ended terms to refer to the recited elements (or steps) without excluding unrecited elements (or steps).

BRIEF DESCRIPTION OF THE DRAWINGS

FIGS. 2A-2D show perspective, cross-sectional, side and top views, respectively, of an electrical component according to a second embodiment.

FIGS. 3A-3C show perspective, top and cross-sectional views, respectively, of an electrical component according to a third embodiment.

DETAILED DESCRIPTION

Figure 1A:
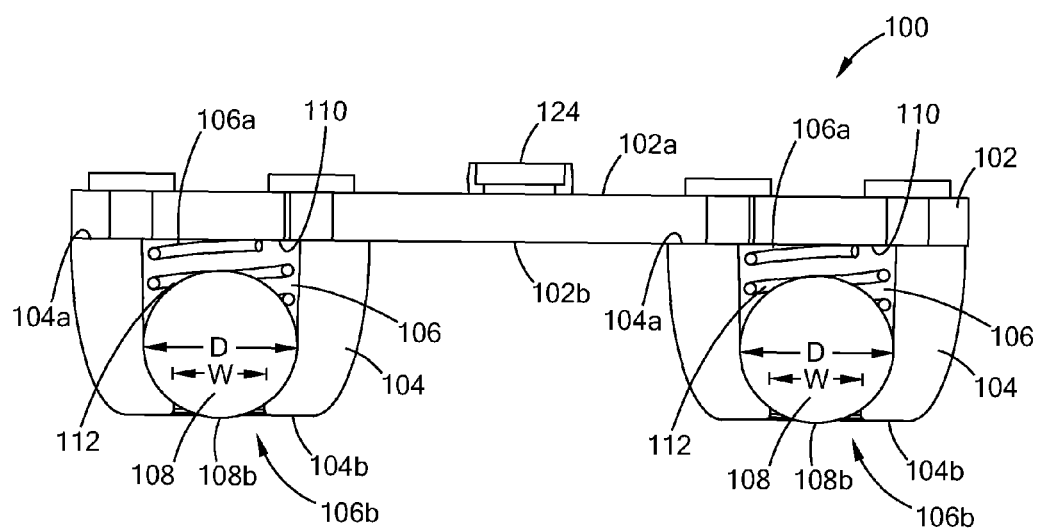
FIGS. 1A and 1B show cross-sectional and perspective views, respectively, of an electrical component according to a first embodiment.
Figure 1B:
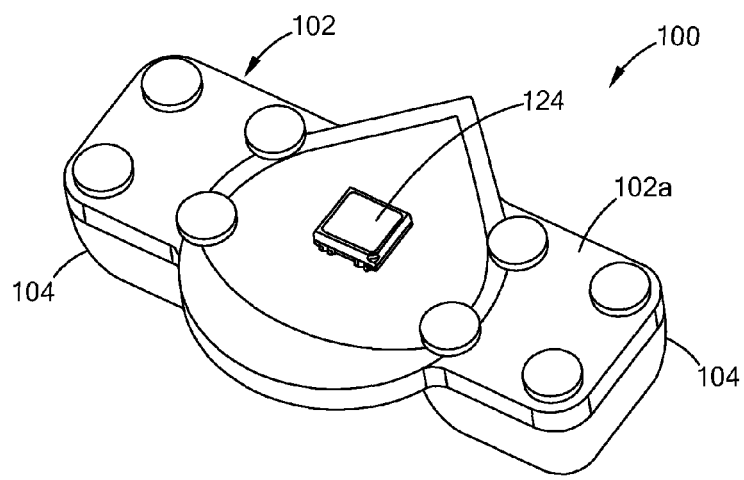

FIGS. 1A and 1B show cross-sectional and perspective views, respectively, of an exemplary electrical component that may be magnetically attached to a substrate (such as paper) for electrical connection with a conductive trace written on the paper. The magnetic attachment may rely on the force between one or more magnets housed within the electrical component and a magnetic backing situated behind the paper and/or a magnetic material present in the conductive trace. The electrical component is engineered to ensure that reliable electrical contact can be made with the conductive trace, even on non-flat or non-uniform surfaces, such as those that have been indented during writing. Simple or more complex circuits may be built up by magnetically attaching one or more electrical components to the paper.

Referring to FIG. 1A, the electrical component 100 comprises a functional electronic part 102 that includes one or more support pillars 104 on an underside 102b thereof. Each of the support pillars 104 includes a channel 106 extending therethrough from a top opening 106a to a bottom opening 106b, where the top opening 106a of the channel 106 is adjacent to the underside 102b of the functional electronic part 102. A magnet 108 is moveably positioned in the channel 106 in electrical contact with the functional electronic part 102. For example, the magnet 108 may be in electrical contact with a conductive pad 110 on the underside 102b of the part 102. Each of the magnets 108 may have an electrically conductive coating thereon to provide a low resistance path for electrical current. The bottom opening 106b of the channel 106 may have a width smaller than a maximum lateral dimension (e.g., width or diameter) of the magnet 108 to ensure that the magnet 108 is not dislodged from the channel 106 during use of the electrical component 100.

The functional electronic part 102 may be a printed circuit board (PCB) that provides mechanical support and electrical connections to an electronic device 124, such as a light emitting diode (LED), which may be positioned on a topside 102a of the PCB, as shown in FIG. 1A. The electronic device 124 may be electrically connected through the PCB or other functional electronic part 102 to one or more conductive pads 110 on the underside 102b of the part 102. The magnet 108 may be in contact with the conductive pad 110, or the magnet 108 may be in contact with an electrically conductive spring 112 positioned between the magnet 108 and the conductive pad 110, as discussed further below. The phrase "in contact" may be understood to mean in direct (physical) contact or in contact via an intervening material or component (e.g., a coating).

Figure 1C:
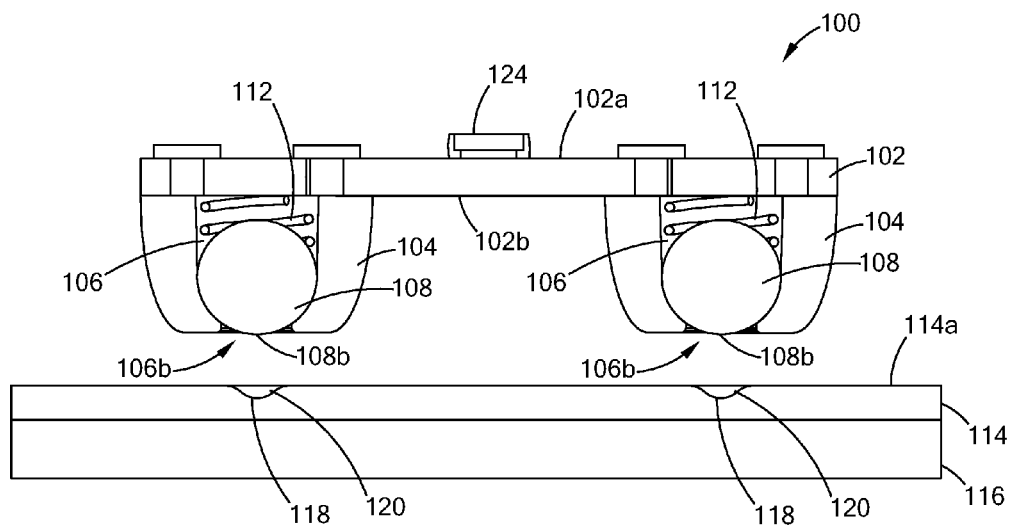
FIGS. 1C and 1D show cross-sectional views of the exemplary electrical component of FIGS. 1A and 1B prior to and after being magnetically connected to a substrate such as paper.
Figure 1D:
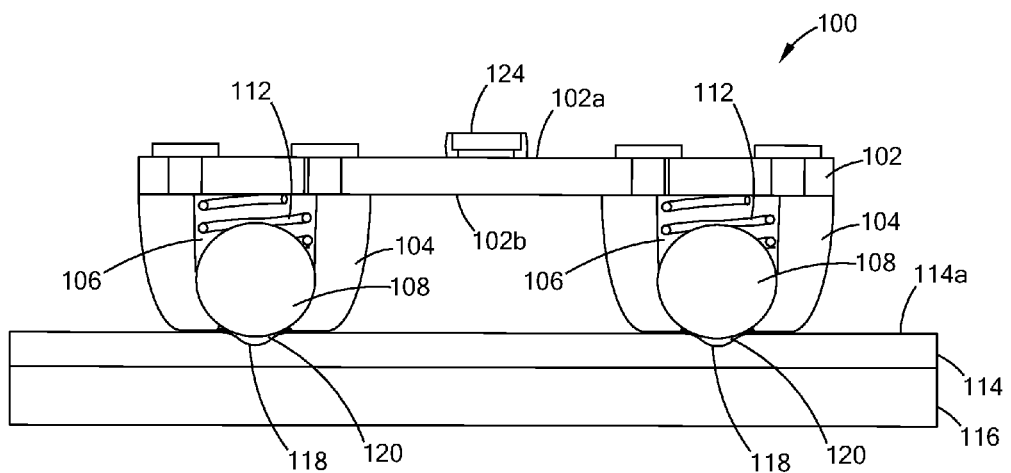

FIGS. 1C-1D show cross-sectional views of the exemplary electrical component 100 of FIGS. 1A and 1B prior to and after being magnetically attached to a substrate 114, such as paper. Prior to attachment, a conductive trace 118 may be written on a top surface 114a of the substrate 114 with a pen or other deposition instrument containing an electrically conductive ink. A magnetic sheet 116 may be adjacent to a bottom surface 114b of the substrate 114, such that the substrate 114 is positioned between the magnetic sheet 116 and the electrical component 100. Also or alternatively, the conductive ink written on the surface 114a to form the conductive trace 118 may include a magnetic material, such as magnetic particles. In either case, the substrate 114 may be said to comprise a magnetic material, given the above-described configurations.

When the electrical component 100 is brought toward the substrate 114, a magnetic force attracts the magnets 108 to the magnetic sheet 116 (and/or the magnetic material). Advantageously, each of the magnets 108 may have a lower surface 108b configured to protrude from the bottom opening 106b of the channel 106 to facilitate making contact with the conductive trace 118. The electrical component 100 may be magnetically attached to the substrate 114 and positioned such that the lower surface 108b of each of the magnets 108 contacts the conductive trace 118, which may be indented into the surface 114a as shown in FIGS. 1C and 1D due to pressure applied during writing. Each of the support pillars 104 housing the magnets 108 may be in direct contact with an unindented portion of the surface 114a, thereby imparting stability to the electrical component 100. The electrical component 100 may thus be securely attached to the paper or other substrate 114 and electrically connected to the conductive trace 118. The magnets 108 shown in FIGS. 1A-1D have a spherical shape; however, magnets of other shapes may also be successfully employed as long as the magnet 108 has a maximum lateral dimension D that is larger than a width W of the bottom opening 106b, so that it remains in the channel 106. In addition, as noted above, the magnet 108 used in each channel 106 may have a lower surface 108b configured to protrude from the bottom opening 106b to facilitate making contact with the conductive trace 118, even if indented into the surface 114a. Alternative magnet geometries and suitable protrusion amounts are discussed further below.

As used herein with respect to the magnet 108, the phrase "moveably positioned in the channel" means that the magnet 108 is situated within the channel 106 with some freedom to move relative to the support pillar 104. Accordingly, the magnet 108 may move and/or the support pillar 104 may move independently. The movement of the magnet 108 relative to the support pillar 104 may be along the direction of the longitudinal axis of the channel 106. The moveable positioning of the magnet 108 within the channel 106 is useful not only for making electrical contact with indented conductive traces, but also for reliably contacting traces on non-flat substrates with electrical components having multiple support pillars.

The magnet 108 may be moveably positioned within the channel 106 using one of several different approaches. At least one support pillar 104 may include an electrically conductive spring 112 positioned between the magnet 108 and the functional electronic part 102. Each electrically conductive spring 112 may contact the functional electronic part (e.g., a conductive pad 110 on the underside 102b) through the top opening 106a of the channel 106. The spring(s) 112 may be calibrated based on the weight of the electrical component 100, such that the force of gravity draws the functional electronic part 102 and support pillars 104 toward a magnetically backed substrate (and/or magnetic conductive trace) which attracts the magnets 108. If the spring(s) 112 are too stiff, the support pillar 104 may not descend to contact the surface 114a of the substrate 114 when the magnet 108 is magnetically pulled to contact the trace 118.

An example of an electrical component 100 being attached to paper or another substrate 114 is shown in FIGS. 1C and 1D. Referring first to FIG. 1C, an exemplary electrical component 100 is placed above a surface 114a of a deformable substrate (e.g., paper) 114, and a magnetic backing or sheet 116 is positioned under the substrate 114, such that the substrate 114 lies between the electrical component 100 and the magnetic sheet 116. The substrate 114 includes a conductive trace 118 written on the surface 114a by a pen containing electrically conductive ink. Because the pen can indent the surface 114a of the substrate 114 during writing, the surface 114a includes a trough or indented portion 120 that contains the conductive trace 118.

As the electrical component 100 is brought toward the conductive trace 118, the magnetic force between the magnet 108 and the magnetic sheet 116 brings the lower surface 108b of the magnet 108 into contact with the recessed conductive trace 118, and the weight of the electrical component 100 causes the support pillar 104 to drop around the magnet 108, allowing the bottom surface 104b of the support pillar 104 to contact a non-indented portion of the substrate 114, as shown in FIG. 1D. Without the moveable positioning of the magnet 108 within the channel 106 that allows for the support pillar 104 to adjust to the height of the substrate surface 114a, the electrical contact between the magnet 108 and the conductive trace 118 could be unreliable and/or the electrical component 100 could be unstably positioned on the surface 114a.

Stacking of electrical components can be enabled by having a conductive pad on the top side of the PCB that is electrically connected to the spring and magnet through a via. Such a configuration would enable connecting two or more electrical components electrically in parallel or in series, and the components of such a stack can be individually addressable.

As an alternative to a separate electrically conductive spring positioned within the channel, the functional electronic part may have at least one structural portion comprising a spring integrally formed therein and positioned above the top opening of the channel. In this case, the magnet may contact the functional electronic part (e.g., by contacting a conductive pad on the underside of the part) through the top opening of the channel. Two exemplary embodiments of such a design are shown in FIGS. 2A-2C and 3A-3C.

FIG. 2A shows a perspective view of an exemplary electrical component 200 which includes two support pillars 204 on an underside 202b thereof as well as a PCB 202 comprising a structural portion 240 with an integrally formed spring 212. The support pillars 204 may also be integrally formed with the PCB or, as shown in this example, they may be attached to the PCB after fabrication. As in the previous embodiment, each of the support pillars 204 includes a channel 206 extending therethrough from a top opening 206a to a bottom opening 206b, and the top opening 206a is adjacent to the underside 202b of the PCB 202.

A magnet 208 may be moveably positioned in the channel 206 in electrical contact with a conductive pad 210 on the underside 202b of the structural portion 240 containing the integrally formed spring 212. In contrast to the embodiment shown in FIG. 1A, the magnet 208 (not a separate electrically conductive spring), is in contact with the conductive pad 210. The spring 212 may have any of a number of different shapes that include a free or flexible end 222 to exert a force against the magnet 208. In the example of FIGS. 2A-2D, the spring 212 has a paddle shape, where the paddle comprises the free end 222. The magnet 208 may have any of the characteristics described elsewhere in this disclosure, including an electrically conductive coating on its surface to provide a low resistance path for electrical current. FIGS. 2B-2D show, respectively, cross-sectional, side and top views of the electrical component 200 of FIG. 2A.

FIG. 3A shows a perspective view of an exemplary electrical component 300 according to another embodiment in which the PCB 302 comprises a structural portion 340 having a spring 312 integrally formed therein, where the spring 312 has a different shape. As above, the electrical component 300 also includes two support pillars 304 on an underside 302b thereof. Each of the support pillars 304 has a channel 306 extending therethrough from a top opening 306a to a bottom opening 306b, and the top opening 306a is adjacent to the underside 302b of the PCB 302. In this example, the spring 312 has a spiral shape where the central portion comprises the free end 322 that exerts a force against the magnet 308, which again may have any of the characteristics described in this disclosure. As in the previous embodiment, the magnet 308 is moveably positioned in the channel 306 in electrical contact with a conductive pad 310 on the underside 302b of the integrally formed spring 312. In contrast to the embodiment shown in FIG. 1A, the magnet 308 (and not a separate electrically conductive spring) is in contact with the conductive pad 310. FIGS. 3B-3C show, respectively, top and cross-sectional views of the electrical component 300 of FIG. 3A.

An alternative way of describing the embodiments of FIGS. 1A-1D, 2A-2D and 3A-3C is set forth below. An electrical component 100,200,300 for attachment to paper and other substrates may comprise a functional electronic part 102,202,302 comprising at least two support pillars 104,204, 304 on an underside 102b,202b,302b thereof. Each of the support pillars 104,204,304 may comprise a channel 106,206, 306 extending therethrough from a top opening 106a,206a, 306a to a bottom opening 106b,206b,306b, where the top opening 106a,206a,306a is adjacent to the underside 102b, 202b,302b of the functional electronic part 102,202,302. A magnet 108,208,308 is moveably positioned in the channel 106,206,306 in electrical contact with the functional electronic part 102,202,302, and a spring 112,212,312 is positioned above each of the magnets.

At least one of the springs may be a separate electrically conductive spring 112 positioned in one of the channels 106 above the magnet 108, such that each electrically conductive spring 112 contacts the functional electronic part 102 through the top opening 106a of the channel 106, as shown for example in FIGS. 1A-1D. Alternatively, at least one of the springs 212,312 may be integrally formed within a structural portion 240,340 of the functional electronic part 202,302 and positioned above the top opening 206a,306a of the channel 206,306, as shown for example in FIGS. 2A-2D and 3A-3C. In these examples, the magnet 208,308 contacts the functional electronic part 202,302 through the top opening 206a, 306a of the channel 206,306.

Generally speaking, a method of attaching an electrical component, such as that described above according to various embodiments, to paper or another substrate includes providing a substrate comprising a magnetic material (e.g., a ferrous material) and having a conductive trace on a top surface thereof, and bringing the electrical component toward the top surface of the substrate. Providing the substrate may entail positioning a magnetic sheet comprising the magnetic material adjacent to a bottom surface of the substrate. Also or alternatively, providing the substrate may entail writing on the top surface with a conductive ink comprising the magnetic material to form the conductive trace.

As set forth above, the electrical component may include a functional electronic part comprising one or more support pillars on an underside thereof, where each of the support pillars comprises a channel extending therethrough. A magnet is moveably positioned in each channel in electrical contact with the functional electronic part. A spring may be positioned above each of the magnets.

As the electrical component is brought toward the top surface of the substrate, a magnetic field between the magnets and the magnetic material brings a lower surface of each of the magnets in contact with the conductive trace. The springs allow the support pillars to settle on (or contact) the top surface independent of the flatness or roughness thereof. At least one of the springs may be an electrically conductive spring positioned between the magnet and the functional electronic part in one of the channels. Also or alternatively, at least one of the springs may be integrally formed within a structural portion of the functional electronic component and positioned above one of the channels, as described above. The bottom opening of the channel may have a width smaller than a maximum lateral dimension of the magnet.

While the magnetic attachment mechanism described herein is believed to be particularly advantageous for attaching electrical components to paper and other substrates, the magnetic attachment technology is more broadly applicable. Referring to FIGS. 1C-1D, the magnetic attachment mechanism can be generally described as including a support pillar 104 for magnetically attaching a component 102 to a substrate 114, where the support pillar 104 comprises: (a) a channel 106 extending therethrough from a top opening 106a to a bottom opening 106b, (b) a magnet 108 moveably positioned in the channel 106, and (c) a spring 112 positioned in the channel 106 adjacent to the top opening 106a and above the magnet 108. When the support pillar 104 is attached to the component 102, the spring 112 contacts an underside 102b of the component 102 through the top opening 106a, and the magnet 108 can magnetically attach to the substrate 114 through the bottom opening 106b. It is beneficial for the bottom opening 106b of the channel 106 to have a width smaller than a maximum lateral dimension of the magnet 108, and the magnet may have a lower surface 108b configured to protrude from the bottom opening 106b, as described above. Typically, but not necessarily, the component is a functional electronic part, the spring is an electrically conductive spring, and the magnet has an electrically conductive coating on its surface.

Referring again to FIG. 1A, an electronic device 124 such as, for example, a switch, LED, motor, buzzer, beeper, speaker, fan, display, hand crank generator, battery, battery connector, power adaptor, USB component, resistor, capacitor, inductor, transistor, relay, thyristor, push button, optical sensor, motion sensor, acoustic sensor, temperature sensor, microphone, eight pin connector, two pin connector, and/or connection cords may be attached to a topside 102a of the functional electronic part (e.g., PCB) 102. The electronic device 124 may be electrically connected through the functional electronic part to one or more conductive pads 110 on the underside 102b of the part 102. When the electrical component 100 is magnetically and electrically attached to a substrate 114, current may flow from the conductive trace 118, through (or around) the magnet 108, to the conductive pads 110, through the PCB 102 and to the electronic device 124.

As described above, it may be beneficial for the lower surface of the magnet to protrude from the bottom opening of the channel in order to reliably contact a conductive trace that may be indented into paper or another substrate. Accordingly, the lower surface of the magnet may have a curved shape. For example, the magnet may have a spherical or oval shape. The lower surface may have a radius of curvature of from about 1 mm to about 10 mm, for example. The lower surface may also or alternatively include one or more protrusions, as can be seen for example in FIG. 3C, which shows a cylindrical magnet with a protrusion defining the lower surface 308b. The amount of protrusion of the lower surface of the magnet is typically from about 0.1 mm to about 1 mm below the bottom surface of the support pillar. The amount of protrusion may also be from about 0.1 mm to about 0.5 mm or from about 0.1 mm to about 0.3 mm below the bottom surface of the support pillar.

Figure 4:
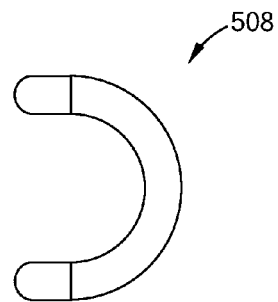
FIG. 4 shows an example of a U-shaped, elastically deformable magnet for use with separate or integrally formed springs.
Figure 5:
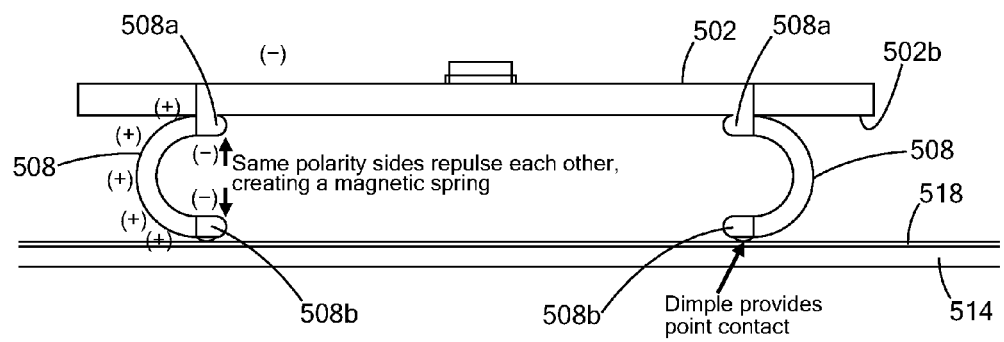
FIG. 5 shows an exemplary electrical component including the U-shaped, elastically deformable magnet of FIG. 4.

It is contemplated that the magnet may have an elastically deformable geometry such that a spring is not needed (either within the channel or as part of the functional electronic part) to ensure moveable positioning of the functional electronic part. An exemplary embodiment is shown in FIGS. 4 and 5, where the elastically deformable magnet 508 has a U-shape with ends having opposite polarity. One end 508a of the deformable magnet 508 may be in electrical contact with the functional electronic part 502 and the other end 508b may be free to make contact with a conductive trace 518 formed in a substrate 514. According to this embodiment, the end 508a of the deformable magnet 508 in electrical contact with the functional electronic part 502 is also attached to the underside 502b of the part 502.

Commercially available or custom made magnets may be incorporated into the electrical component. The magnet may be a permanent magnet formed from a ferromagnetic material. The ferromagnetic material may be a metal, alloy or compound comprising one or more elements selected from the group consisting of Fe, Co, Ni, Cr, Nd, Sm, Gd, and Dy. For example, the ferromagnetic material may be a iron-aluminum-nickel-cobalt ("AlNiCo") alloy or a rare earth alloy such as samarium-cobalt (Sm—Co) or neodymium-iron-boron (Nd—Fe—B). It is also contemplated that a ferromagnetic material that is not a permanent magnet may be employed for the magnets; in this case, the magnetic sheet that lies behind the substrate and/or the magnetic particles incorporated into the conductive trace may be permanently magnetized.

The optional but advantageous conductive coating on the surface of the magnet may include one or more metals selected from the group consisting of Ag, Au, Cr, Cu, Ni, Sn and Zn, for example. The coating may be a multilayer coating that comprises a plurality of layers. Besides enhancing the conductivity of the magnet, the conductive coating may help prevent oxidation of the underlying magnetic material. Suitable magnets with or without a conductive coating are commercially available from various suppliers, such as K&J Magnetics, Inc. (Pipersville, Pa.). For example, spherical Nd—Fe—B magnets of 5 mm diameter and a strength grade of N35 may be used in the electrical component.

The magnetic sheet that may in some embodiments underlie the substrate may also be formed of a ferromagnetic material. The ferromagnetic material may be a metal, alloy or compound containing one or more elements selected from the group consisting of Fe, Co, Ni, Cr, Nd, Sm, Gd, and Dy. The magnetic sheet may be composed of paper containing fibrous magnetic material (such as iron filings) and laminated with clean (unfilled) paper. Typically, the magnets housed in the electrical component are permanent magnets; however, it is contemplated that the magnetic sheet may be permanently magnetized, and a ferromagnetic material that is not a permanent magnet may be used for the magnets.

The magnetic material that may be incorporated into the conductive ink that forms the conductive trace may take the form of magnetic particles, such as iron, iron oxide, and/or chromium oxide particles. The magnetic particles may be nanoscale in size, and may be obtained from suppliers of particles and dispersions for magnetic recording media. Typically, only a small amount of the magnetic material is incorporated into the conductive ink to avoid substantially reducing the conductivity of the conductive trace.

The substrate on which the conductive trace is formed (e.g., by writing with a rollerball pen containing a conductive ink, such as a silver ink) may be paper, cardstock, cardboard, plastic (one or more polymers), or another substrate, which may be rigid, flexible, and/or deformable. In some cases the substrate may be indented as the pen moves over the surface to deposit the conductive ink. Typically, the substrate has a thickness of about 0.04 inch or less in the case of paper, but thicker substrates may be used by adjusting the strength of the magnetic field to ensure that a magnetic sheet placed behind or under the substrate in some embodiments can be accessed by the magnets.

Functional electronic parts such as PCBs are commercially available and their fabrication is well known in the art. The exemplary PCBs shown in the figures include attachment holes to provide a means of attachment to the support pillars. Such attachment holes may be formed by drilling through the PCB in predetermined positions so as to align with pegs that may be formed on the top surface of the support pillars. The electronic devices that may be attached to the PCB are also known in the art and commercially available from various vendors. Electrically conductive springs suitable for use in the electrical component are readily commercially available. For embodiments of the electrical component in which the PCB contains an integrally formed spring, the desired spring pattern (e.g., the paddle or spiral shape shown in FIGS. 2A and 3A) may be formed in the PCB by one or more routing steps, which are well known in PCB fabrication.

Each support pillar may be made of one or more polymers, such as acrylonitrile butadiene styrene (ABS) or polycarbonate, and may be fabricated to have the desired size and shape by injection molding or another polymer processing method known in the art. One, two, three, four, five, six or more support pillars may be used. In some embodiments, each support pillar may include one or more pegs extending from a top surface thereof for attachment to the functional electronic part. The pegs may be secured to the part (e.g., PCB) by any of a number of methods known in the art, such as by an adhesive or by heat staking, as described below in reference to FIGS. 6A-6C.

Figure 6A:
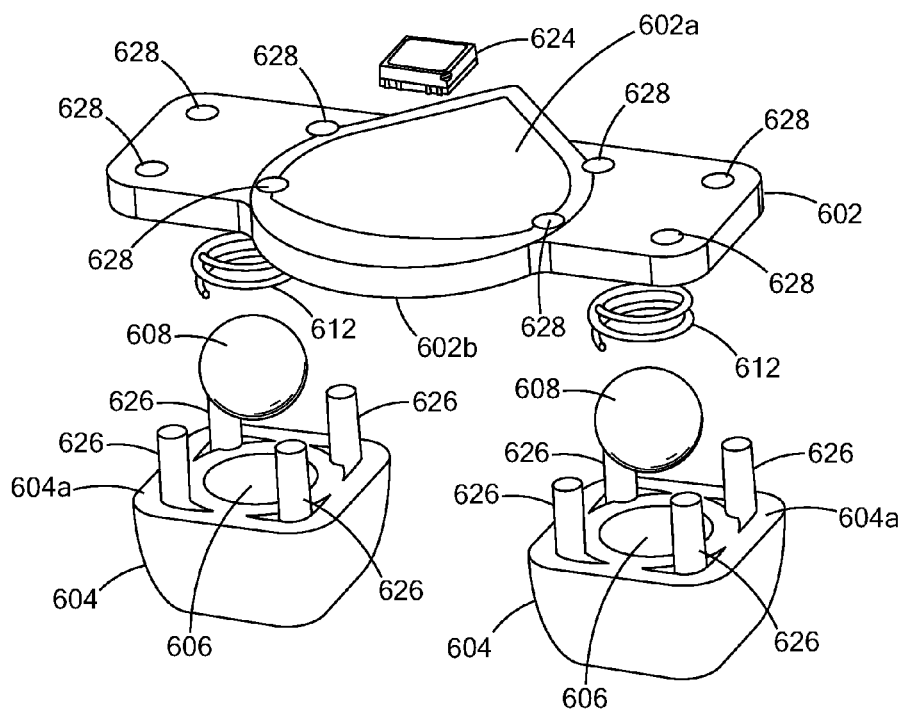
FIGS. 6A-6C show assembly and fabrication of an exemplary electrical component.
Figures 6B, 6C:
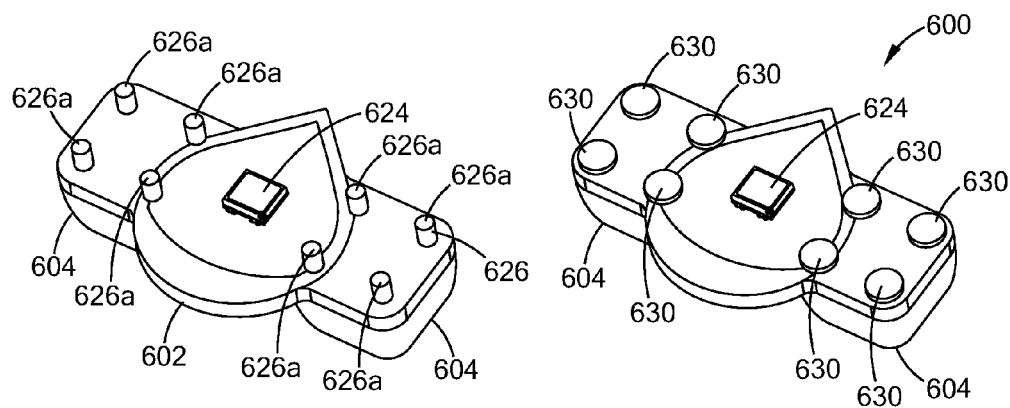

FIG. 6A shows two injection molded support pillars 604 prior to securing to a PCB 602. At least one peg 626 extends from the top surface 604*a* of each of the support pillars 604 (in this example, there are four pegs 626 extending from the top surface 604*a* of each support pillar 604). The PCB 602 includes a number of attachment holes 628 (in this example, eight) aligned with the pegs 626 and passing through the PCB 602 from the underside 602*b* to the topside 602*a*. To assemble the electrical component 600, a magnet 608 and, in some embodiments, a spring 612 are loaded into the channel 606 of each support pillar 604, and the pegs 626 are passed through the attachment holes 628 such that an end 626*a* of each peg 626 protrudes from the topside 602*a* of the PCB 602, as shown in FIG. 6B. In some embodiments, the spring 612 may be soldered to the underside 602*b* of the PCB 602. Such a spring may have a spiral shape, as shown in the figures, or may have another resilient configuration, such as a folded tab.

To secure the support pillars 604 to the PCB 602, the pegs 626 may be flattened after insertion into the attachment holes 628 using a heat staking process, typically at a temperature around the glass transition temperature of the polymer (e.g., about 150° C. for ABS). After heat staking, each of the pegs 626 has a flattened top portion 630 having a lateral dimension larger than the width of the attachment hole 628 to secure the support pillars 604 to the PCB 602, as shown in FIG. 6C. An electronic device 624 may further be attached to the topside 602*a* of the PCB 602.

Alternatively, instead of being formed separately and then attached to the PCB, the support pillars may be integrally formed with the PCB such that the top surface of each support pillar is not merely in contact with the underside of the PCB, but is actually a part of the underside.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. An electrical component for attachment to paper and other substrates, the electrical component comprising:
    a functional electronic part comprising one or more support pillars on an underside thereof, each of the support pillars comprising:
        a channel extending therethrough from a top opening to a bottom opening, the top opening of the channel being adjacent to the functional electronic part; and
        a magnet moveably positioned in the channel in electrical contact with the functional electronic part, wherein the bottom opening of the channel has a width smaller than a maximum lateral dimension of the magnet.

2. The electrical component of claim 1, wherein each of the magnets comprises an electrically conductive coating thereon, and
    wherein each of the magnets is in electrical contact with a conductive pad on the underside of the functional electronic part.

3. The electrical component of claim 1, wherein at least one of the support pillars further comprises an electrically conductive spring positioned in the channel between the magnet and the functional electronic part, the electrically conductive spring contacting the functional electronic part through the top opening of the channel.

4. The electrical component of claim 1, wherein the magnet in at least one of the channels contacts the functional electronic part through the top opening of the channel.

5. The electrical component of claim 1, wherein the functional electronic part comprises at least one structural portion having a spring integrally formed therein and positioned above the top opening of one of the channels.

6. The electrical component of claim 1, wherein the functional electronic part comprises a printed circuit board (PCB) for providing mechanical support and electrical connections to one or more electronic devices.

7. The electrical component of claim 1, wherein, in at least one of the channels, the magnet has a lower surface configured to protrude from the bottom opening thereof.

8. The electrical component of claim 1, further comprising:
    a substrate comprising a conductive trace thereon, the conductive trace being in contact with a lower surface of each of the magnets; and
    a magnetic sheet under the substrate, the substrate being positioned between the magnetic sheet and the electrical component,
    wherein the electrical component remains in contact with the substrate due to magnetic attraction between the magnets and the magnetic sheet.

9. The electrical component of claim 1, further comprising:
    a substrate comprising a conductive trace thereon, the conductive trace including a magnetic material and being in contact with a lower surface of each of the magnets,
    wherein the electrical component remains in contact with the substrate due to magnetic attraction between the magnets and the magnetic material in the conductive trace.

10. An electrical component for attachment to paper and other substrates, the electrical component comprising:

a functional electronic part comprising one or more support pillars on an underside thereof, each of the support pillars comprising:
- a channel extending therethrough from a top opening to a bottom opening, the top opening of the channel being adjacent to the functional electronic part; and
- a magnet moveably positioned in the channel in electrical contact with the functional electronic part, wherein a spring is positioned above each of the magnets.

11. The electrical component of claim 10, wherein, for each of the support pillars, the bottom opening of the channel has a width smaller than a maximum lateral dimension of the magnet.

12. The electrical component of claim 10, wherein each of the magnets comprises an electrically conductive coating thereon, and wherein each of the magnets is in electrical contact with a conductive pad on the underside of the functional electronic part.

13. The electrical component of claim 10, wherein the spring is an electrically conductive spring positioned in the channel between the magnet and the functional electronic part, the electrically conductive spring contacting the functional electronic part through the top opening of the channel.

14. The electrical component of claim 10, wherein the functional electronic part comprises at least one structural portion having the spring integrally formed therein and positioned above the top opening.

15. The electrical component of claim 10, wherein at least one of the magnets comprises an elastically deformable geometry.

16. The electrical component of claim 10, wherein the functional electronic part comprises a printed circuit board (PCB) for providing mechanical support and electrical connections to one or more electronic devices.

17. The electrical component of claim 10, wherein, in at least one of the channels, the magnet has a lower surface configured to protrude from the bottom opening thereof.

18. A magnetic attachment mechanism comprising:
- a support pillar for magnetically attaching a component to a substrate, the support pillar comprising:
  - a channel extending therethrough from a top opening to a bottom opening;
  - a magnet moveably positioned in the channel; and
  - a spring positioned in the channel adjacent to the top opening and above the magnet, wherein, when the support pillar is attached to the component, the spring contacts an underside of the component through the top opening, and the magnet can magnetically attach to the substrate through the bottom opening.

19. The magnetic attachment mechanism of claim 18, wherein the bottom opening of the channel has a width smaller than a maximum lateral dimension of the magnet.

20. The magnetic attachment mechanism of claim 18, wherein the component is a functional electronic part, the spring is an electrically conductive spring, and the magnet has an electrically conductive coating thereon.

\* \* \* \* \*